United States Patent
Suzuki

(10) Patent No.: US 9,721,771 B2
(45) Date of Patent: Aug. 1, 2017

(54) FILM FORMING APPARATUS

(71) Applicant: Tokyo Electron Limited, Tokyo (JP)

(72) Inventor: Yusuke Suzuki, Beaverton, OR (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/060,453

(22) Filed: Mar. 3, 2016

(65) Prior Publication Data

US 2016/0260589 A1 Sep. 8, 2016

(30) Foreign Application Priority Data

Mar. 6, 2015 (JP) .................................. 2015-044352

(51) Int. Cl.
*C23C 14/35* (2006.01)
*H01J 37/34* (2006.01)

(52) U.S. Cl.
CPC .......... *H01J 37/345* (2013.01); *C23C 14/352* (2013.01); *H01J 37/3447* (2013.01)

(58) Field of Classification Search
CPC .... C23C 14/352; H01J 37/3447; H01J 37/345
USPC .............. 204/298.09, 298.11, 298.2, 298.18, 204/298.03
See application file for complete search history.

(56) References Cited

U.S. PATENT DOCUMENTS

| 4,622,121 A | * | 11/1986 | Wegmann | ........... H01J 37/3405 |
| | | | | 204/298.18 |
| 5,584,971 A | * | 12/1996 | Komino | ................ C23C 14/541 |
| | | | | 118/723 E |
| 2005/0199490 A1 | | 9/2005 | Nomura et al. | |
| 2009/0211897 A1 | | 8/2009 | Tsunekawa | |

FOREIGN PATENT DOCUMENTS

| JP | 2005-256112 | 9/2005 |
| JP | 2009-221595 | 10/2009 |
| KR | 10-2014-0027458 A | 3/2014 |

* cited by examiner

*Primary Examiner* — Rodney McDonald

(57) ABSTRACT

A film forming apparatus includes a processing chamber, a gas supply unit, a stage, at least one holder, a power supply, at least one magnet and a magnet rotation unit. The gas supply unit is configured to supply a gas into the processing chamber. The stage is provided in the processing chamber, and has a center coinciding with a central axis which extends in a vertical direction. The stage is configured to cool the object to about −50° C. or below. Each holder is configured to hold a target, and extends in an annular shape above the stage inside the processing chamber. The power supply is configured to generate a voltage to be applied to the target. Each magnet is provided outside the processing chamber and faces the target. The magnet rotation unit is configured to rotate the magnet about the central axis.

5 Claims, 8 Drawing Sheets

FILM FORMING APPARATUS

CROSS-REFERENCE TO RELATED APPLICATIONS

This application claims priority to Japanese Patent Application No. 2015-044352 filed on Mar. 6, 2015, the entire contents of which are incorporated herein by reference.

FIELD OF THE INVENTION

The disclosure relates to a film forming apparatus, and more particularly, to a film forming apparatus for forming a thin film on an object to be processed especially by sputtering.

BACKGROUND OF THE INVENTION

In manufacturing electronic devices, various processes are performed on an object to be processed. A thin film forming process is an example of such processes. A sputtering film forming apparatus is known as an apparatus for forming a thin film on an object to be processed.

For example, Japanese Patent Application Publication Nos. 2009-221595 and 2005-256112 disclose therein a sputtering film forming apparatus including a processing chamber, a stage, a plurality of targets and a plurality of shutters. In this film forming apparatus, the stage is provided in the processing chamber and rotatable about a central axis extending in a vertical direction while passing through the center of the stage. The targets are arranged above the stage along a circumferential direction. The shutters are provided between the stage and the targets and are rotatable independently. In the film forming apparatus disclosed in Japanese Patent Application Publication Nos. 2009-221595 and 2005-256112, a single target or two or more targets selected among the plurality of targets are exposed to the stage by rotating the plurality of shutters, and the target materials sputtered from the exposed targets are deposited on an object to be processed. The uniformity of the thin film formed on the object is improved by rotating the stage about the central axis when the target materials are deposited on the object.

However, there exists a device whose characteristics can be improved when forming a thin film in a state where the object is cooled to an extremely low temperature. A vertical magnetization-type MTJ (Magnetic Tunnel Junction) device used for a MRAM (Magnetoresistive Random Access Memory) or the like is an example of such device. The MTJ device includes two magnetic layers and a tunnel barrier layer disposed between the two magnetic layers. When such a MTJ device is manufactured, the tunnel barrier layer is formed on a first magnetic layer, and then, a second magnetic layer is formed on the tunnel barrier layer. The present inventors have found that the characteristics of the MTJ device can be improved by forming the second magnetic layer at an extremely low temperature.

Specifically, it has been found that the MTJ device having the second magnetic layer formed on the tunnel barrier layer at about −50° C. or below has high perpendicular magnetic anisotropy energy. The second magnetic layer formed at an extremely low temperature is considered as a high-quality thin film capable of improving the characteristics of the MTJ device.

In order to form a high-quality thin film, it is considered to transfer an object cooled by a cooling device into a film forming apparatus and form a thin film on the cooled object in the film forming apparatus. However, since the temperature of the object increases while it is being transferred from the cooling device to the film forming apparatus, the cooling effect to the object may decrease. In addition, since a process of transferring the object from the cooling device to the film forming apparatus is added, processing throughput decreases.

SUMMARY OF THE INVENTION

In view of the above, the disclosure provides a film forming apparatus capable of forming a high-quality thin film while preventing decrease of a processing throughput.

In accordance with an aspect, there is provided a film forming apparatus for forming a thin film on an object by sputtering. The film forming apparatus includes a processing chamber, a gas supply unit, a stage, at least one holder, a power supply, at least one magnet and a magnet rotation unit. The gas supply unit is configured to supply a gas into the processing chamber. The stage is provided in the processing chamber, and has a center coinciding with a central axis which extends in a vertical direction. The stage is configured to cool the object to about −50° C. or below. Each holder is configured to hold a target, and extends in an annular shape above the stage inside the processing chamber. The power supply is configured to generate a voltage to be applied to the target. Each magnet is provided outside the processing chamber and faces the target. The magnet rotation unit is configured to rotate the magnet about the central axis.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
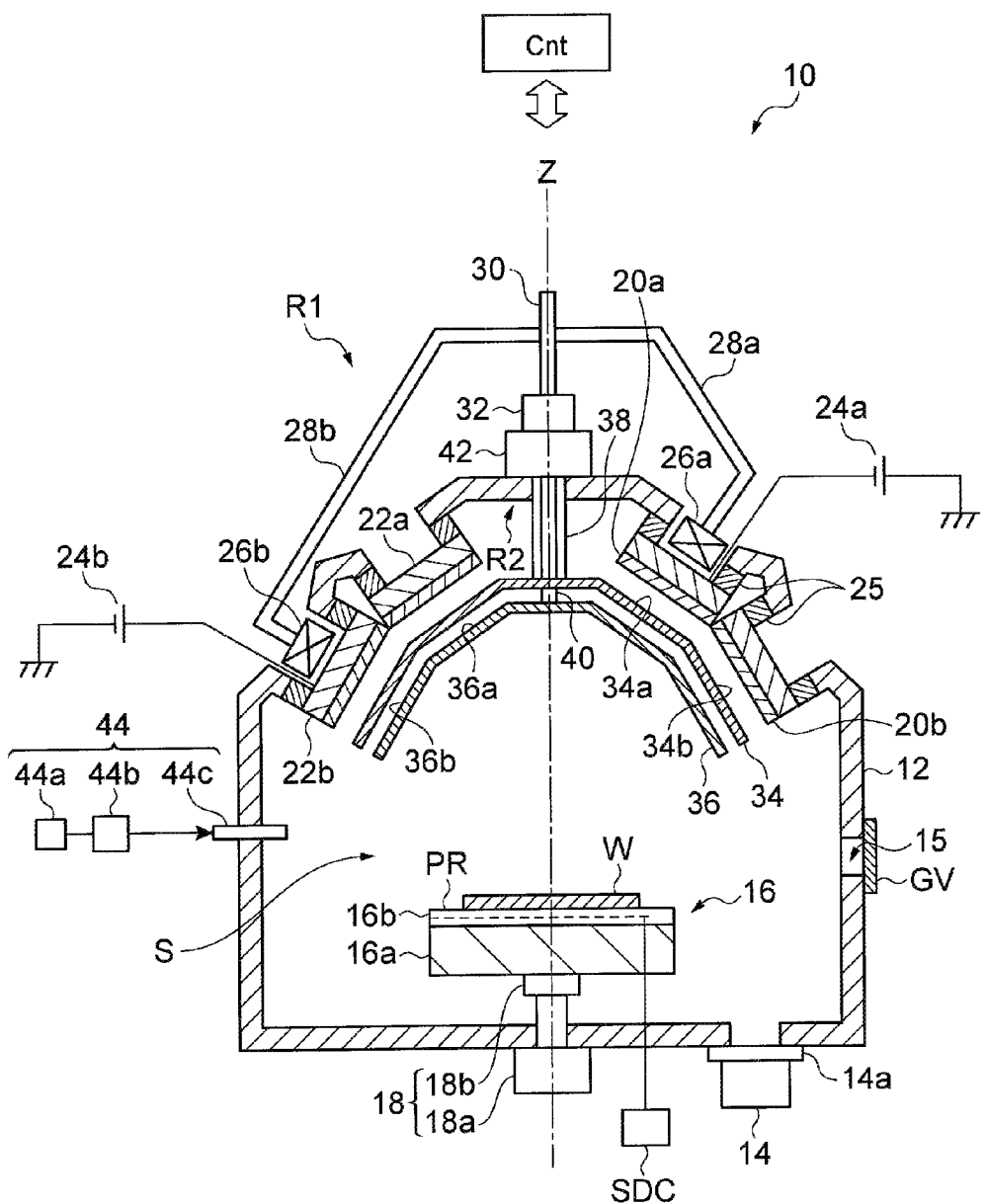
FIG. 1 schematically shows a film forming apparatus in accordance with an embodiment.

Hereinafter, embodiments will be described in detail with reference to the accompanying drawings. Like reference numerals will be used for like or corresponding parts throughout the drawings.

FIG. 1 schematically shows a vertical cross section of a film forming apparatus according to an embodiment. A film forming apparatus 10 shown in FIG. 1 includes a processing chamber 12. The processing chamber 12 is made of, e.g., aluminum, and connected to a ground potential. The processing chamber 12 defines therein a space S. A gas exhaust unit 14 for depressurizing the space S is connected to a bottom portion of the processing chamber 12 through an adaptor 14a. Formed at a sidewall of the processing chamber 12 is an opening 15 for transferring an object to be processed (hereinafter, referred to as "wafer") W. A gate valve GV for opening/closing the opening 15 is provided at the sidewall.

A stage 16 is provided in the processing chamber 12. The stage 16 is a non-rotary mounting table for mounting thereon the wafer W. The stage 16 may be vertically movable in the processing chamber 12. The stage 16 includes a base portion 16a and an electrostatic chuck 16b. The base portion 16a is made of a material having a high thermal conductivity, e.g., copper, and has a substantially disc shape.

The electrostatic chuck 16b is provided on the base portion 16a. The electrostatic chuck 16b has a dielectric film and an electrode embedded in the dielectric film. A DC power supply SDC is connected to the electrode of the electrostatic chuck 16b. The wafer W mounted on the electrostatic chuck 16b is attracted and held on the electrostatic chuck 16b by electrostatic force generated by the electrostatic chuck 16b. An area on the top surface of the electrostatic chuck 16b where the wafer W is mounted serves as a mounting area PR for the wafer W.

The center of the stage 16 substantially coincides with a central axis Z extending along the vertical direction. In other words, the central axis Z passes through the center of the mounting area PR, i.e., the center of the stage 16.

The stage 16 has a chiller 18 capable of cooling the wafer W to −50° C. or below. The chiller 18 provides to the stage 16 a function of cooling the wafer W mounted on the stage 16. The chiller 18 includes a main body 18a and a cooling head 18b. The cooling head 18b provides a cooling surface and is contact with the base portion 16a. The main body 18a cools the cooing head 18b by a Gifford-McMahon cycle (G-M cycle) using a helium (He) gas. The chiller 18 has a function of cooling the wafer W mounted on the stage 16 to about −50° C. or below and preferably about −100° C. or below. The chiller 18 is not limited to a chiller using the G-M cycle as long as the wafer W can be cooled to the above-described temperature range.

A first target 20a and a second target 20b are provided above the stage 16. In the embodiment shown in FIG. 1, two targets are provided. However, one or more targets, e.g., three or more targets, may be provided.

The first target 20a and the second target 20b are provided in the processing chamber 12 to face the stage 16. The first target 20a has an annular shape extending along the circumferential direction of the central axis Z. More specifically, the first target 20a has a conical surface shape whose center coincides with the central axis Z. The second target 20b is provided below the first target 20a. In other words, the first target 20a and the second target 20b are arranged in parallel along the central axis Z. The second target 20b has an annular shape about the central axis Z. More specifically, the second target 20b has a conical surface shape whose center coincides with the central axis Z. The surfaces of the first and the second target 20a and 20b which face the stage 16 are inclined with respect to a plane perpendicular to the central axis Z (i.e., horizontal plane) toward the mounting area PR. The inclined angle of the first target 20a with respect to the horizontal plane is different from that of the second target 20b with respect to the horizontal plane. Specifically, when viewed from a cross section taken along a plane including the central axis Z, an angle between the surface of the first target 20a and the horizontal plane is smaller than an angle between the surface of the second target 20b and the horizontal plane.

The first and the second target 20a and 20b are made of materials that are optionally selected depending on types of thin films to be formed. For example, the first and the second target 20a and 20b may be made of Co, FeB, CoFeB, W, Ta or the like. The first and the second target 20a and 20b may be made of different materials. For example, in the case of forming a CoFeB layer as a thin film, the first target 20a may be made of Co and the second target 20b may be made of FeB.

The first and the second target 20a and 20b are held by a first and a second holder 22a and 22b made of a metal, respectively. The first and the second holder 22a and 22b have an annular shape about the central axis Z and are held at a ceiling of the processing chamber 12 through insulating members 25. A power supply 24a is connected to the first target 20a via the first holder 22a. A power supply 24b is connected to the second target 20b via the second holder 22b. The film forming apparatus 10 may include, instead of the power supplies 24a and 24b, a single power supply capable of selectively applying a voltage to the first and the second target 20a and 20b.

The film forming apparatus 10 further includes a first and a second magnet 26a and 26b. The first magnet 26a is provided outside the processing chamber 12 and opposite to the first target 20a with the first holder 22a interposed therebetween. The second magnet 26b is provided outside the processing chamber 12 and opposite to the second target 20b with the second holder 22b interposed therebetween. One end of an arm 28a is coupled to the first magnet 26a and one end of an arm 28b is coupled to the second magnet 26b. The other ends of the arms 28a and 28b are coupled to a rotation shaft 30. The rotation shaft 30 extends along the central axis Z. An end portion of the rotation shaft 30 is coupled to a rotary drive mechanism 32. The rotary drive mechanism generates a power for rotating the rotation shaft 30 about the central axis Z. By the power, the first and the second magnet 26a and 26b separately rotate about the central axis Z along the conical outer surfaces of the first and the second target 20a and 20b, respectively. The arms 28a and 28b, the rotation shaft 30 and the rotary drive mechanism 32 serve as a magnet rotation unit R1 for rotating the first and the second magnet 26a and 26b about the central axis Z. The rotary drive mechanism 32 is connected to and controlled by a control unit Cnt to be described later.

A first and a second shutter 34 and 36 are provided between the stage 16 and the first and the second target 20a and 20b. The first shutter 34 has a surface extended along the circumferential direction of the central axis Z and is provided along the first and the second target 20a and 20b. The first shutter 34 has a first portion 34a facing the first target 20a and a second portion 34b facing the second target 20b. In other words, the surfaces of the first and the second portion 34a and 34b of the first shutter 34 are inclined with respect to the plane perpendicular to the central axis Z at different angles. The second shutter 36 is provided along and below the first shutter 34. The second shutter 36 has a first portion 36a facing the first portion 34a and a second portion 36a facing the second portion 34b. In other words, the surfaces of the first and the second portion 36a and 36b of the second shutter 36 are inclined with respect to the plane perpendicular to the central axis Z at different angles.

Figure 2:
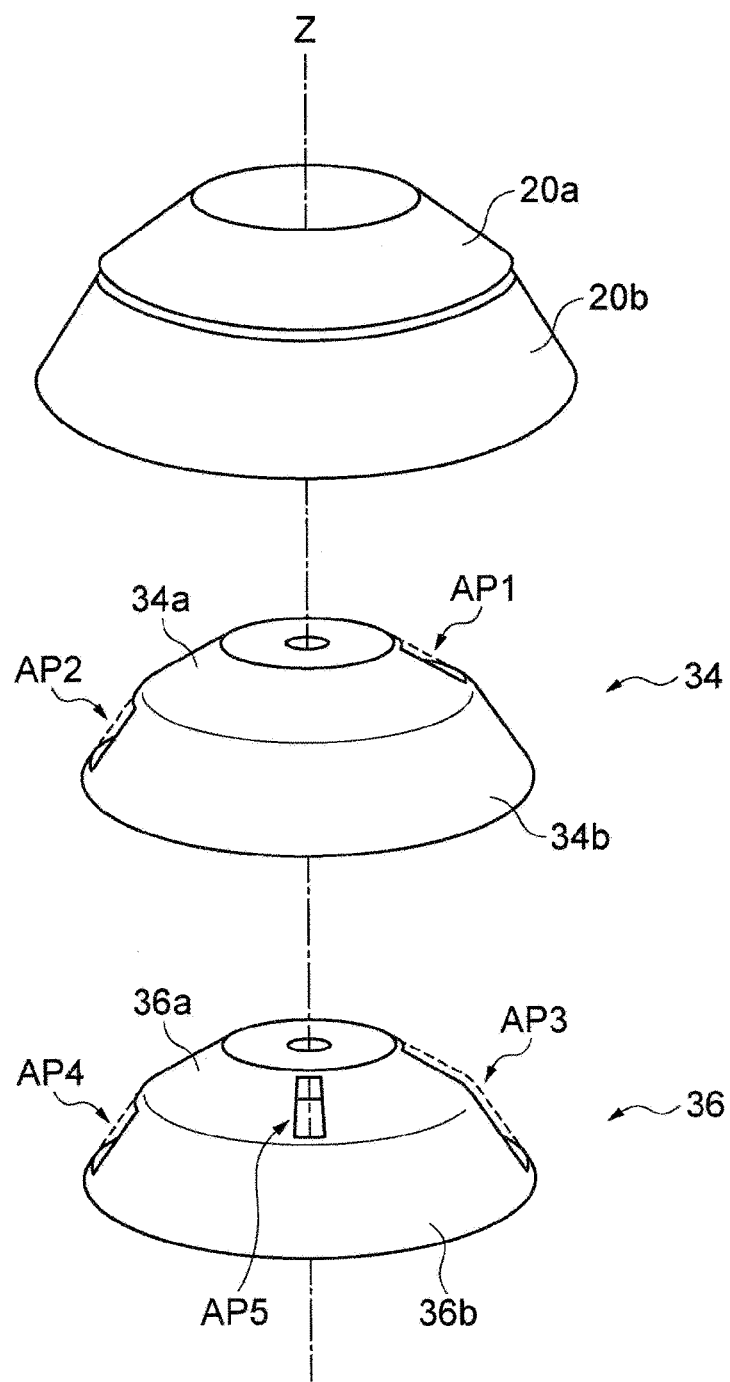
FIG. 2 is a perspective view of a first target, a second target, a first shutter and a second shutter.
Figure 3A:
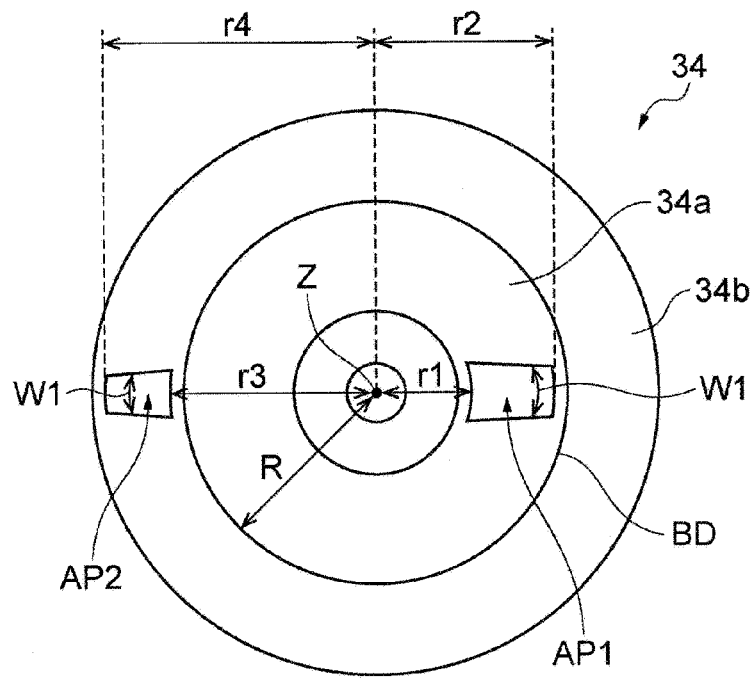
FIGS. 3A to 5B are top views of the first shutter and the second shutter.
Figure 3B:
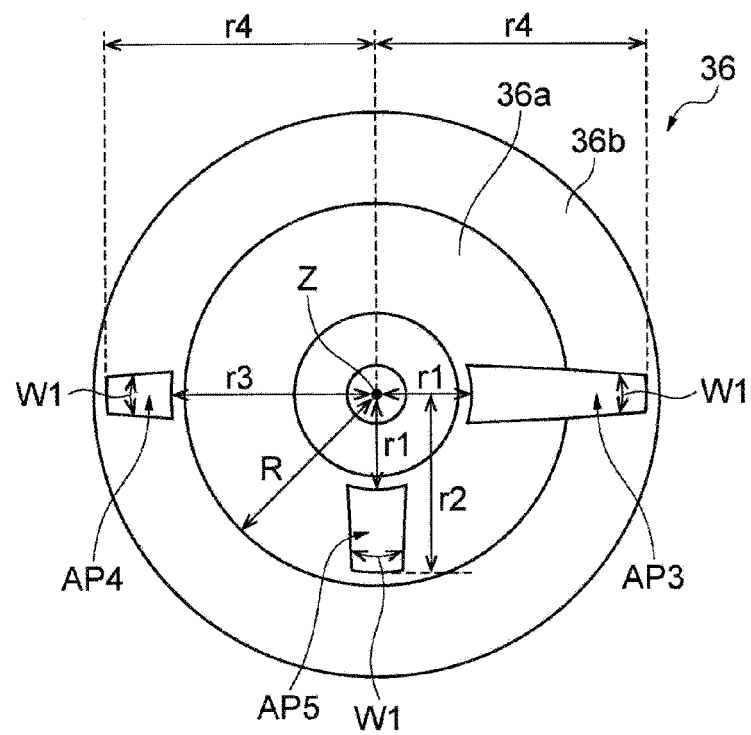

The first and the second shutter 34 and 36 will be described further with reference to FIGS. 2, 3A and 3B. FIG. 2 is a perspective view of the first and the second target 20a and 20b and the first and the second shutter 34 and 36. FIGS. 3A and 3B are respectively top views of the first and the second shutter 34 and 36. As shown in FIGS. 2, 3A and 3B, each of the first and the second shutter 34 and 36 has a plurality of openings through which a part of each of the first and the second target 20a and 20b is exposed to the stage 16.

The area of the openings is greater than the area of the surfaces of the first and the second magnet 26a and 26b which face the first and the second target 2a and 20b.

Specifically, the first shutter 34 has a first and a second opening AP1 and AP2. As shown in FIG. 3A, the first and the second opening AP1 and AP2 have a width W1 in a tangent direction of a circle having the central axis Z as its center. The first opening AP1 is formed in the first portion 34a of the first shutter 34 and the second opening AP2 is formed in the second portion 34b of the first shutter 34. In the first shutter 34, the first opening AP1 extends from a position spaced from the central axis Z by a distance r1 to a position spaced from the central axis Z by a distance r2. The second opening AP2 is formed in a position deviated by 180° from the first opening AP1 in the circumferential direction of the central axis Z. In the first shutter 34, the second opening AP2 extends from a position spaced from the central axis Z by a distance r3 to a position spaced from the central axis Z by a distance r4. Here, the distance from the central axis Z to a boundary BD between the first portion 34a and the second portion 34b is set to R, and the distances r1 to r4 satisfy the relation of r1<r2<R<r3<r4.

The second shutter 36 has a third to a fifth opening AP3 to AP5. As shown in FIG. 3B, the third to the fifth opening AP3 to AP5 have a width W1 in a tangent direction of a circle having the central axis Z as its center. The third opening AP3 is formed to traverse the first and the second portion 36a and 36b of the second shutter 36. The fourth opening AP4 is formed in the second portion 36a of the second shutter 36. The fifth opening AP5 is formed in the first portion 36a of the second shutter 36. In the second shutter 36, the third opening AP3 extends from a position spaced from the central axis Z by the distance r1 to a position spaced from the central axis Z by the distance r4. The fourth opening AP4 is formed in a position deviated by about 180° from the third opening AP3 in the circumferential direction of the central axis Z. The fourth opening AP4 extends from a position spaced from the central axis Z by the distance r3 to a position spaced from the central axis Z by the distance r4. The fifth opening AP5 is formed in a position deviated by about 90° from the third and the fourth opening AP3 and AP4 in the circumferential direction of the central axis Z. The fifth opening AP5 extends from a position spaced from the central axis Z by the distance r1 to a position spaced from the central axis Z by the distance r2.

The third opening AP3 may not necessarily traverse the first and the second portion 36a and 36b. For example, the third opening AP3 may include a sixth opening formed in the first portion 36a, and a seventh opening formed in the second portion 36b. The sixth and the seventh opening may be formed in positions deviated by 180° from the fourth opening AP4 in the circumferential direction of the central axis Z. The fifth opening AP5 may not necessarily be formed in the position deviated by 90° from the third and the fourth opening AP3 and AP4 in the circumferential direction of the central axis Z. The fifth opening AP5 may be formed in another position deviated from the third and the fourth opening AP3 and AP4 in the circumferential direction of the central axis Z. For example, the fifth opening AP5 may be formed in a position deviated by 30° or by 45° from the third opening AP3 in the circumferential direction of the central axis Z.

As shown in FIG. 1, a first rotation shaft 38 is coupled to a central portion of the first shutter 34. The first rotation shaft 38 is a cylindrical member and its central axis substantially coincides with the central axis Z. One end of the first rotation shaft 38 is coupled to the central portion of the first shutter 34 in the processing chamber 12. A second rotation shaft 40 is coupled to a central portion of the second shutter 36. The second rotation shaft 40 is a substantially columnar member inserted coaxially into the first rotation shaft 38. One end of the second rotation shaft 40 is coupled to the central portion of the second shutter 36 in the processing chamber 12. The first and the second rotation shaft 38 and 40 extend to the outside of the processing chamber 12 while passing through the upper portion of the processing chamber 12. At the outside of the processing chamber 12, the other ends of the first rotation shaft 38 and the second rotation shaft 40 are connected to a rotary drive mechanism 42.

The rotary drive mechanism 42 generates power for separately rotating the first and the second rotation shaft 38 and 40. The first and the second rotation shaft 38 and 40 can be separately rotated about the central axis Z by the power thus generated. Accordingly, the first and the second shutter 34 and 36 can be separately rotated about the central axis Z. By separately rotating the first and the second shutter 34 and 36 about the central axis Z, the positions of the openings formed in the first and the second shutter 34 and 36 can be adjusted in the circumferential direction of the central axis Z. The first rotation shaft 38, the second rotation shaft 40 and the rotary drive mechanism 42 serve as a shutter rotation unit R2 for separately rotating the first and the second shutter 34 and 36 about the central axis Z. The rotary drive mechanism 42 is connected to and controlled by the control unit Cnt to be described later.

As shown in FIG. 1, the film forming apparatus 10 further includes a gas supply unit 44 for supplying a gas into the processing chamber 12. In one embodiment, the gas supply unit 44 includes a gas source 44a, a flow rate controller 44b such as a mass flow controller, and a gas inlet 44c. The gas source 44a is a source of a gas to be excited in the processing chamber 12, e.g., a source of Ar gas. The gas source 44a is connected to the gas inlet 44c via the flow rate controller 44b. The gas inlet 44c is a gas line for introducing the gas from the gas source 44a into the processing chamber 12.

The film forming apparatus 10 further includes the control unit Cnt. The control unit Cnt controls the respective components of the film forming apparatus 10. The control unit Cnt is, e.g., a computer device, and may include an input device such as a keyboard or a touch panel, a storage unit such as a memory for storing a recipe, and an output interface for outputting control signals to the central processing unit (CPU) and the respective components of the film forming apparatus 10.

For example, the control unit Cnt separately controls the rotation positions and the rotation speeds of the first and the second shutter 34 and 36 by sending the control signal to the rotary drive mechanism 42. Accordingly, the control unit Cnt can allow one or both of the first and the second target 20a and 20b to be selectively exposed to the stage 16. Hereinafter, an area in the targets which is exposed to the stage 16 through the openings of the first and the second shutter 34 and 36 is referred to as "exposed area".

Figure 4A:
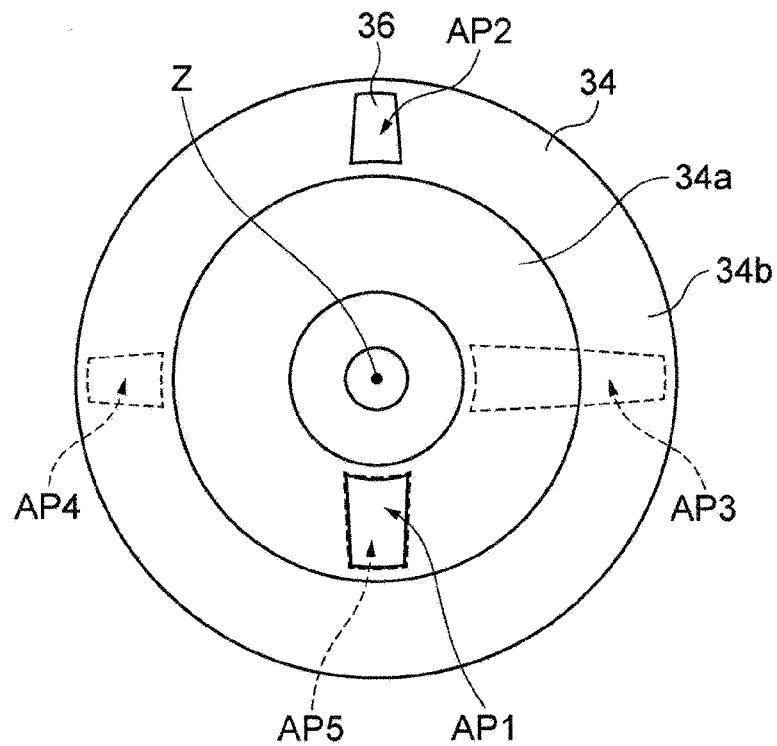

FIGS. 4A, 4B, 5A and 5B are top views of the first and the second shutter 34 and 36 overlapped with each other. For example, the control unit Cnt can control the rotation positions of the first and the second shutter 34 and 36 as shown in FIG. 4A. Referring to FIG. 4A, the first opening AP1 of the first shutter 34 is located at a position overlapped with the fifth opening AP5 of the second shutter 36. In this rotation position, the second opening AP2 of the first shutter 34 is located at a position that is not overlapped with the third and the fourth opening AP3 and AP4 of the second shutter 36. In other words, referring to FIG. 4A, the first and the fifth opening AP1 and AP5 are located at the same position in the circumferential direction of the central axis Z and the second opening AP2 is deviated from all of the openings formed in the second shutter 36. Therefore, when the rotary drive mechanism 42 is controlled such that the first and the second shutter 34 and 36 are located at the rotation position shown in FIG. 4A, a part of the first target 20a is exposed to the stage 16 through the first and the fifth opening AP1 and AP5 and the second target 20b is shielded from the stage 16.

Figure 4B:
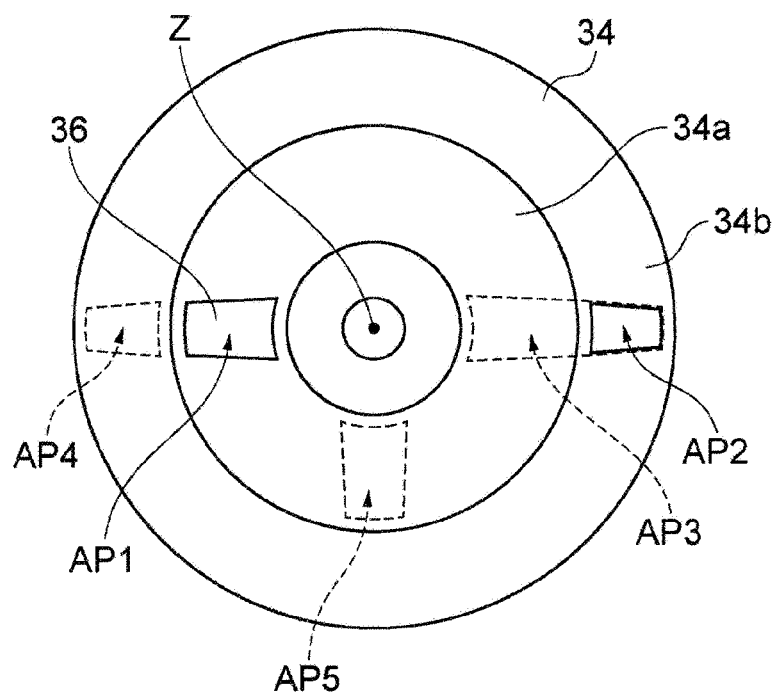

Further, the control unit Cnt can control the rotation positions of the first and the second shutter 34 and 36 as shown in FIG. 4B. Referring to FIG. 4B, the second opening AP2 of the first shutter 34 is overlapped with a part of the third opening AP3 of the second shutter 36. In this rotation position, the first opening AP1 of the first shutter 34 is not overlapped with the fourth and the fifth opening AP4 and AP5 of the second shutter 36. In other words, referring to FIG. 4B, the first opening AP1 is deviated from all of the openings formed in the second shutter 36, and the second and the third opening AP2 and AP3 are located at the same position in the circumferential direction of the central axis Z. Accordingly, when the rotary drive mechanism 42 is controlled such that the first and the second shutter 34 and 36 are located at the rotation positions shown in FIG. 4B, the first target 20a is shielded from the stage 16 and a part of the second target 20b is exposed to the stage 16 through the second and the third opening AP2 and AP3.

Figure 5A:
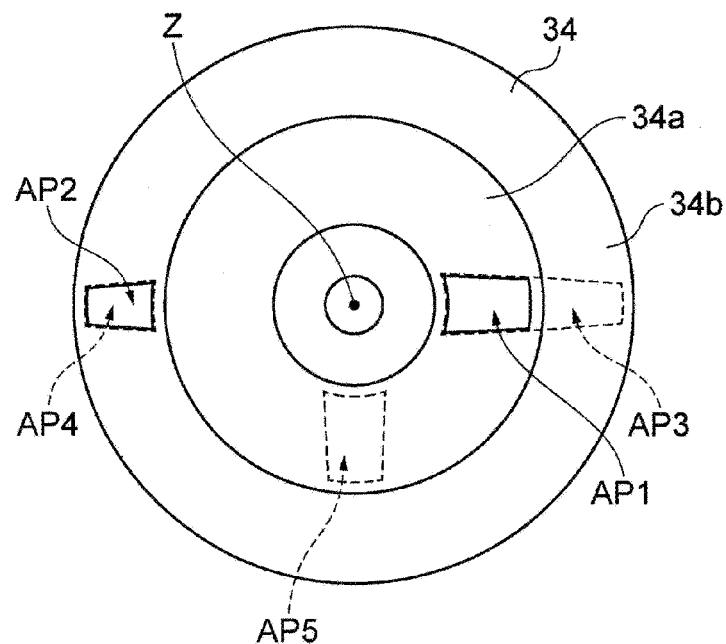

The control unit Cnt can control the rotation positions of the first and the second shutter 34 and 36 as shown in FIG. 5A. Referring to FIG. 5A, the first opening AP1 of the first shutter 34 is overlapped with a part of the third opening AP3 of the second shutter 36. In this rotation position, the second opening AP2 of the first shutter 34 is overlapped with the fourth opening AP4 of the second shutter 36. In other words, referring to FIG. 5A, the first and the third opening AP1 and AP3 are located at the same position and the second and the fourth opening AP2 and AP4 are located at the same position in the circumferential direction of the central axis Z. Therefore, when the rotary drive mechanism 42 is controlled such that the first and the second shutter 34 and 36 are located at the rotation positions shown in FIG. 5A, a part of the first target 20a is exposed to the stage 16 through the first and the third opening AP1 and AP3 and a part of the second target 20b is exposed to the stage 16 through the second and the fourth opening AP2 and AP4.

Figure 5B:
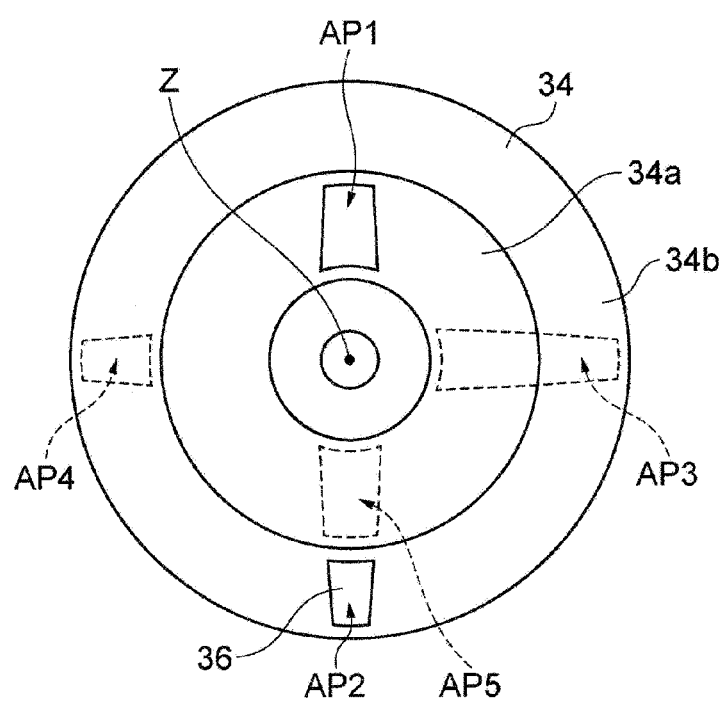

Further, the control unit Cnt can control the rotation positions of the first and the second shutter 34 and 36 as shown in FIG. 5B. Referring to FIG. 5B, the first and the second opening AP1 and AP2 of the first shutter 34 are not overlapped with any of the third to the fifth opening AP3 to AP5 of the second shutter 36. In other words, referring to FIG. 5B, the first and the second opening AP1 and AP2 are deviated from all of the openings formed in the second shutter 36 in the circumferential direction of the central axis Z. Therefore, when the rotary drive mechanism 42 is controlled such that the first and the second shutter 34 and 36 are located at the rotation positions shown in FIG. 5B, the first and the second target 20a and 20b are shielded from the stage 16.

As described above, the control unit Cnt can control the rotary drive mechanism 42 such that one or both of the first and the second target 20a and 20b is selectively exposed to the stage 16. Further, the control unit Cnt can allow both of the first and the second target 20a and 20b to be shielded from the stage 16.

The control unit Cnt can control the rotation positions and the rotation speeds of the first and the second magnet 26a and 26b by sending the control signal to the rotary drive mechanism 32. For example, the control unit Cnt can control the rotation positions of the first and the second magnet 26a and 26b such that the first magnet 26a faces the exposed area of the first target 20a and the second magnet 26b faces the exposed area of the second target 20b. In other words, in this rotation position, the first opening AP1 of the first shutter 34 and the third opening AP3 of the second shutter 36 are positioned on a straight line connecting the stage 16 and the first magnet 26a, and the second opening AP2 of the first shutter 34 and the forth opening AP4 of the second shutter 36 are positioned on a straight line connecting the stage 16 and the second magnet 26b. Further, the control unit Cnt can control the rotary drive mechanisms 32 and 42 such that the first and the second magnet 26a and 26b and the first and the second shutter 34 and 36 rotate in synchronization with each other while maintaining the corresponding rotation position.

In this film forming apparatus 10, the gas is supplied from the gas supply unit 44 into the processing chamber 12 and excited by applying voltages from the power supplies 24a and 24b to the first and the second target 20a and 20b. Positive ions in the plasma collide with the first and the second target 20a and 20b, so that target materials are sputtered from the first and the second target 20a and 20b. As a consequence, the materials forming the first and the second target 20a and 20b are deposited on the wafer W. In this film forming apparatus 10, the exposed areas of the first and the second target 20a and 20b are moved in the circumferential direction of the central axis Z in synchronization with the first and the second magnet 26a and 26b. Therefore, the target can be uniformly consumed in the circumferential direction of the central axis Z by the collision of positive ions in the plasma. Accordingly, the materials of the first and the second target 20a and 20b can be uniformly deposited on the wafer W in the circumferential direction of the central axis Z. As a result, the thin film can be uniformly formed on the wafer W without rotating the stage 16 about the central axis Z.

Figure 6:
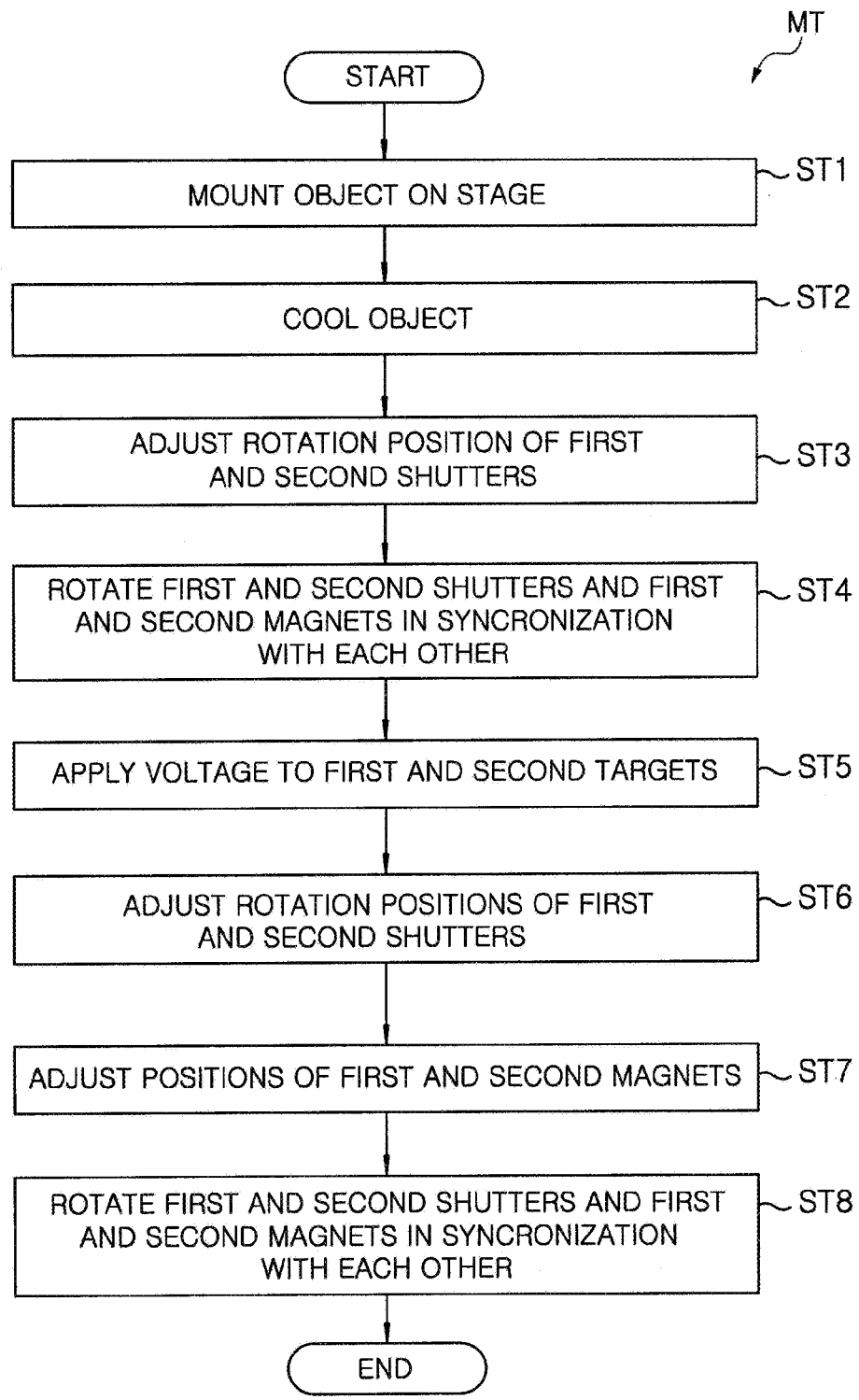
FIG. 6 is a flowchart of a film forming method in accordance with an embodiment.

Hereinafter, a film forming method according to an embodiment and an operation of the film forming apparatus 10 shown in FIG. 1 will be described. FIG. 6 is a flowchart of a film forming method MT according to the embodiment. In the method MT, a CoFeB film is formed on the wafer W which is cooled to an extremely low temperature of about −50° C. or below. In order to form such thin film, the film forming apparatus 10 includes the first target 20a made of Co, and the second target 20b made of FeB.

In the method MT shown in FIG. 6, first, the wafer W is mounted on the stage 16 in step ST1. Then, in step ST2, the wafer W on the stage 16 is cooled to an extremely low temperature of about −50° C. or below by the chiller 18. Next, steps ST3 to ST5 are executed. In steps ST3 to ST5, a process of cutting the surfaces of the first and the second target 20a and 20b, i.e., pre-sputtering, is performed in a state where both of the first and the second target 20a and 20b are shielded from the stage 16. In step ST3, the control unit Cnt controls the rotation positions of the first and the second shutter 34 and 36 by controlling the rotary drive mechanism 42. Specifically, in step ST3, the rotary drive mechanism 42 is controlled such that the first and the second shutter 34 and 36 are located at the rotation position shown in FIG. 5B. Accordingly, both of the first and the second target 20a and 20b are shielded from the stage 16.

Next, in step ST4, the first and the second shutter 34 and 36, and the first and the second magnet 26a and 26b are rotated in synchronization with each other about the central axis Z. Then, in step ST5, voltages are applied from the power supplies 24a and 24b to the first and the second target 20a and 20b. Accordingly, a process of removing impurities adhered to the surfaces of the first and the second target 20a and 20b, i.e., pre-sputtering, is performed. During the pre-sputtering, both of the first and the second target 20a and 20b are shielded from the stage 16, so that contamination of the wafer W is reduced or prevented.

Figure 7A:
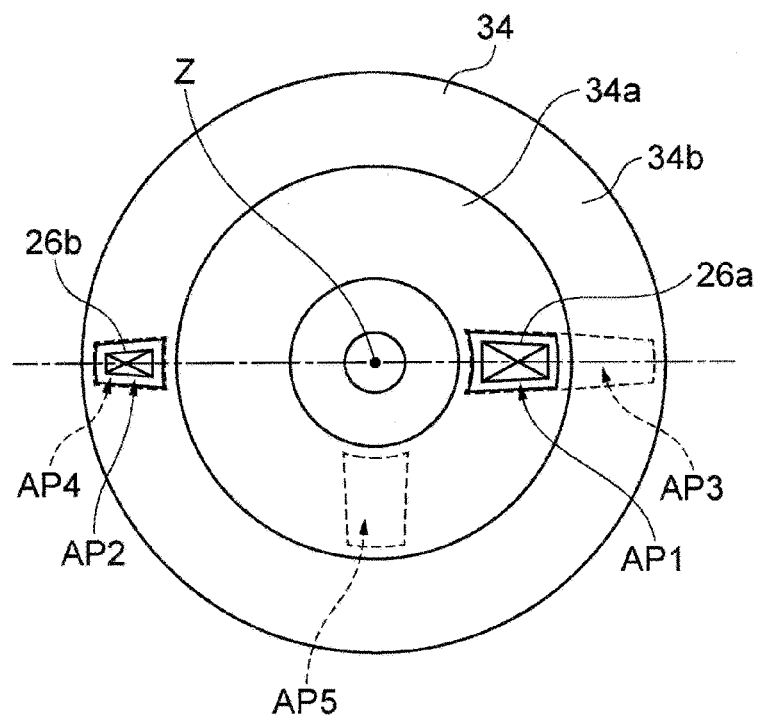
FIGS. 7A and 7B are diagrams in which a first and a second magnet are projected on the top views of the first and the second shutter.
Figure 7B:
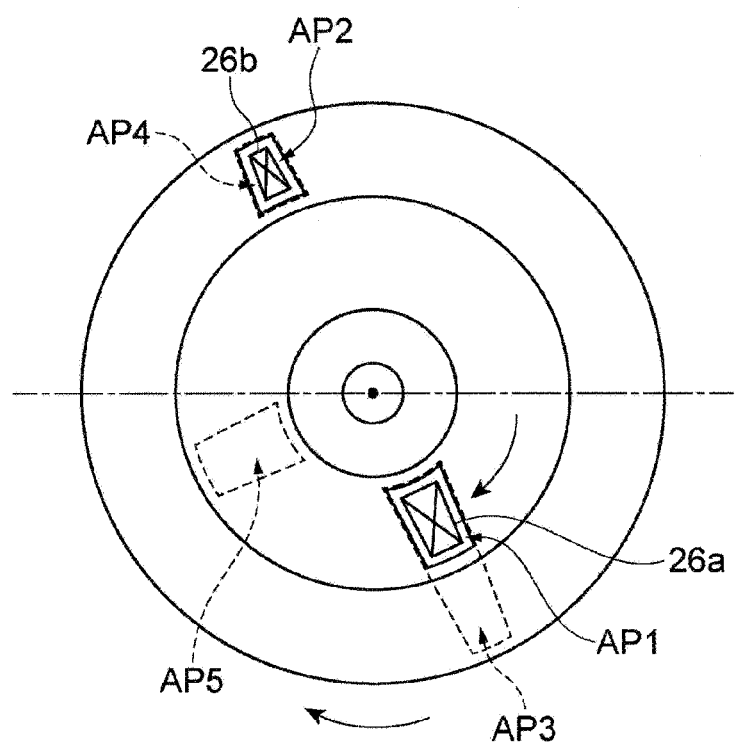

Next, step ST6 of the method MT is executed. In step ST6, in a state where the first and the second shutter 34 and 36 and the first and the second magnet 26a and 26b are rotated, the control unit Cnt adjusts the rotation positions of the first and the second shutter 34 and 36 by controlling the rotary drive mechanism 42. Specifically, in the step ST6, the rotary drive mechanism 42 is controlled such that the first and the second shutter 34 and 36 are located at the rotation positions shown in FIG. 5A. Accordingly, a part of the first target 20a is exposed to the stage 16 through the first and the third opening AP1 and AP3 and a part of the second target 20b is exposed to the stage 16 through the second and the fourth opening AP2 and AP4. Then, step ST7 is executed. In step ST7, in a state where the first and the second shutter 34 and 36 and the first and the second magnet 26a and 26b are rotated, the relative positions of the first and the second magnet 26a and 26b with respect to the openings formed in the first and the second shutter 34 and 36 are adjusted such that the first magnet 26a is disposed at a position corresponding to the exposed area of the first target 20a and the second magnet 26b is disposed at a position corresponding to the exposed area of the second target 20b. FIGS. 7A and 7B are diagrams in which the first and the second magnet 26a and 26b are projected on the top views of the first and the second shutter 34 and 36. In step ST7, as shown in FIG. 7A, the first magnet 26a faces a part of the first and the third opening AP1 and AP3 and the second magnet 26b faces a part of the second and the fourth opening AP2 and AP4. In one embodiment, the steps ST6 and ST7 may be executed simultaneously.

Next, in step ST8, the first and the second shutter 34 and 36 and the first and the second magnet 26a and 26b are rotated in synchronization with each other about the central axis Z. Thus, as shown in FIG. 7B, the first and the second shutter 34 and 36 and the first and the second magnet 26a and 26b are rotated while maintaining the state in which the first opening AP1 and a part of the third opening AP3 are positioned on the straight line connecting the stage 16 and the first magnet 26a, and the second and the fourth opening AP2 and AP4 are positioned on the straight line connecting the stage 16 and the second magnet 26b. Accordingly, the materials of the first and the second target 20a and 20b are deposited on the wafer W. As a result, a CoFeB film is formed on the wafer W.

In the method MT shown in FIG. 6, the materials of the first and the second target 20a and 20b are simultaneously deposited on the wafer W. However, in one embodiment, a material of only one selected from the first and the second target 20a and 20b may be deposited on the wafer W. In that case, in step ST6, the rotation positions of the first and the second shutter 34 and 36 are adjusted such that either one of the first or second target 20a or 20b is exposed to the stage 16. When it is not necessary to perform the pre-sputtering before a thin film is formed on the wafer W, the steps ST3 to ST5 of the method MT may be omitted. In that case, in step ST8, at the same time or after the first and the second shutter 34 and 36 and the first and the second magnet 26a and 26b are rotated in synchronization with each other about the central axis Z, the voltages are applied from the power supplies 24a and 24b to the first and the second target 20a and 20b.

Hereinafter, various test examples will be described. However, the present disclosure is not limited to the following test examples.

In a test example 1 and a comparative example 1, the MTJ device having a structure in which the first magnetic layer, the tunnel barrier layer, and the second magnetic layer are laminated in that order was manufactured by using the film forming apparatus 10 shown in FIG. 1. In the MTJ devices manufactured in the test example 1 and the comparative example 1, the first and the second magnetic layer were a CoFeB layer and the tunnel barrier layer was an MgO layer. In the test example 1, the second magnetic layer was formed on the tunnel barrier layer while setting the temperature of the stage 16 to 50K (about −223° C.) Meanwhile, in the comparative example 1, the second magnetic layer was formed on the tunnel barrier layer while setting the temperature of the stage 16 to 300K (about 27° C.). In the test example 1 and the comparative example 1, the MTJ device was manufactured under the same conditions except the temperature at which the second magnetic layer is formed.

Figure 8:
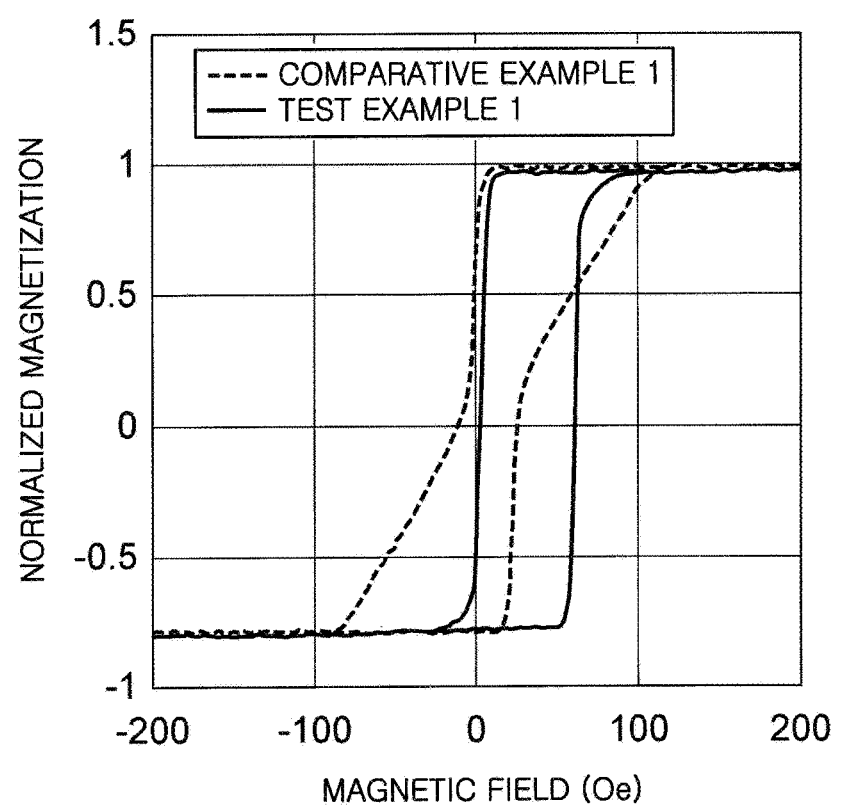
FIG. 8 is a graph showing magnetization curves of MJT devices manufactured in a test example 1 and a comparative example 1.

FIG. 8 shows magnetization curves of the MJT devices manufactured in the test example 1 and the comparative example 1. As shown in FIG. 8, the magnetization curve of the hysteresis loop of the MTJ device manufactured in the comparative example 1 is inclined at a large angle, whereas the magnetization curve of the hysteresis loop of the MTJ device manufactured in the test example 1 is inclined at a small angle and substantially at a right angle. As the inclination of the magnetization curve of the hysteresis loop becomes small and close to a right angle, the perpendicular magnetic anisotropy energy becomes high. It is clear from the result shown in FIG. 8 that the characteristics of the MTJ device can be improved by forming the second magnetic layer on the tunnel barrier layer in a state where the object is cooled to an extremely low temperature when the MTJ device is manufactured. The MTJ device having high perpendicular magnetic anisotropy energy can improve information storage stability of the MRAM. Thus, the second magnetic layer formed in the test example 1 can be considered as a high-quality film capable of improving the characteristics of the MTJ device.

While various embodiments have been described, the present disclosure may be variously modified without being limited to the above-described embodiments. For example, the film forming apparatus 10 shown in FIG. 1 includes two magnets, i.e., the first and the second magnet 26a and 26b, and two shutters, i.e., the first and the second shutter 34 and 36. However, when a single target is provided, a single magnet and a single shutter may be provided.

In one embodiment, the film forming apparatus 10 may include a mechanism for opening the upper portion of the processing chamber 12 in order to perform a maintenance work of the film forming apparatus 10. For example, a hinge may be provided at a side surface of the processing chamber 12 and used as a fulcrum in opening/closing the upper portion of the processing chamber 12 together with the first and the second target 20a and 20b of the processing chamber 12. By providing such a mechanism, the first and the second target 20a and 20b can be easily replaced. With this configuration, the upper portion of the processing chamber 12 can be supported from the top by an arm coupled to the sidewall of the processing chamber 12 in order to prevent the upper portion of the processing chamber 12 from being separated in attaching/detaching the first and the second target 20a and 20b.

While the disclosure has been shown and described with respect to the embodiments, it will be understood by those skilled in the art that various changes and modifications may be made without departing from the scope of the disclosure as defined in the following claims.

What is claimed is:

1. A film forming apparatus for forming a thin film on an object by sputtering, comprising:
   a processing chamber;
   a gas supply unit configured to supply a gas into the processing chamber;
   a stage disposed in the processing chamber, the stage having a center coinciding with a central axis extending in a vertical direction and configured to cool the object to about −50° C. or below;
   at least one holder each of which is configured to hold a target, extending in an annular shape, above the stage in the processing chamber;
   a power supply configured to generate a voltage to be applied to the target;
   at least one magnet provided outside the processing chamber to face the target;
   a magnet rotation unit configured to rotate the at least one magnet about the central axis;
   at least one shutter provided between the target and the stage, having at least one opening through which a part of the target is exposed to the stage;
   a shutter rotation unit configured to rotate the at least one shutter about the central axis; and
   a control unit configured to control the magnet rotation unit and the shutter rotation unit to rotate in synchronization with each other about the central axis in a state that the at least one opening is positioned on a straight line connecting the stage and the at least one magnet.

2. The film forming apparatus of claim 1, wherein the at least one holder includes:
   a first holder configured to hold a first target; and
   a second holder configured to hold a second target made of a material different from the first target.

3. The film forming apparatus of claim 2, wherein the at least one shutter includes:
   a first shutter disposed between the targets and the stage; and
   a second shutter disposed between the first shutter and the stage,
   wherein the first shutter has a plurality of openings and the second shutter has a plurality of openings,
   wherein the shutter rotation unit is configured to separately rotate the first shutter and the second shutter about the central axis, and
   wherein the control unit is configured to control the shutter rotation unit to cause one or both of the first target and the second target to be selectively exposed to the stage, or to cause both of the first target and the second target to be shielded from the stage.

4. The film forming apparatus of claim 2, wherein the at least one magnet includes a first magnet and a second magnet,
   wherein the first magnet is disposed outside the processing chamber to face the first target and the second magnet is disposed outside the processing chamber to face the second target, and
   wherein the magnet rotation unit is configured to rotate the first magnet and the second magnet about the central axis.

5. The film forming apparatus of claim 3, wherein the at least one magnet includes a first magnet and a second magnet,
   wherein the first magnet is disposed outside the processing chamber to face the first target and the second magnet is disposed outside the processing chamber to face the second target, and
   wherein the magnet rotation unit is configured to rotate the first magnet and the second magnet about the central axis.

* * * * *